(12) United States Patent
Miyano et al.

(10) Patent No.: US 6,862,435 B2
(45) Date of Patent: Mar. 1, 2005

(54) RF TRANSMISSION CIRCUIT, COMPLEX DIGITAL SYNTHESIZER, AND MRI APPARATUS

(75) Inventors: Hiroyuki Miyano, Tokyo (JP); Masakazu Kinomoto, Tokyo (JP)

(73) Assignee: GE Medical Systems Global Technology, LLC, Waukesha, WI (US)

( * ) Notice: Subject to any disclaimer, the term of this patent is extended or adjusted under 35 U.S.C. 154(b) by 442 days.

(21) Appl. No.: 10/188,451

(22) Filed: Jul. 3, 2002

(65) Prior Publication Data

US 2003/0008626 A1 Jan. 9, 2003

(30) Foreign Application Priority Data

Jul. 4, 2001 (JP) ........................................ 2001-203566

(51) Int. Cl.[7] .............................................. H04B 1/04
(52) U.S. Cl. ................... 455/114.1; 455/127.2; 375/295; 375/354; 327/105; 327/107
(58) Field of Search ...................... 455/91, 114.1, 455/114.2, 114.3, 115.1, 127.1, 127.2, 118, 119; 375/130, 140, 145, 149, 293, 295, 354, 356, 358, 362; 327/100, 105, 106, 107, 113, 119; 708/271, 272

(56) References Cited

U.S. PATENT DOCUMENTS

| | | | |
|---|---|---|---|
| 4,827,219 A | 5/1989 | Harrison | |
| 4,881,034 A | 11/1989 | Kaufman et al. | |
| 4,897,604 A | 1/1990 | Carlson et al. | |
| 4,899,109 A | 2/1990 | Tropp et al. | |
| 4,998,072 A * | 3/1991 | Sheffer | 327/106 |
| 5,436,600 A | 7/1995 | Van Heteren et al. | |
| 5,629,624 A | 5/1997 | Carlson et al. | |
| 6,041,088 A * | 3/2000 | McCallister | 375/358 |
| 6,147,492 A | 11/2000 | Zhang et al. | |
| 6,249,539 B1 * | 6/2001 | Harms et al. | 375/130 |

* cited by examiner

Primary Examiner—Quochien B. Vuong
(74) Attorney, Agent, or Firm—Carl B. Horton, Esq.; Armstrong Teasdale LLP (57) ABSTRACT

An RF transmission circuit, complex digital synthesizer and MRI apparatus are intended to enhance the stability of signal quantity and reduce the cost, wherein a complex digital synthesizer generates reference carrier frequency signal data directly in the digital domain, RF envelope mixers combine the resulting data and RF envelope signal data in the digital domain, and a digital frequency up-converter up-converts the resulting signal data in the digital domain and converts into an analog RF pulse signal.

14 Claims, 8 Drawing Sheets

Complex Digital Synthesizer 30

FIG. 4

Digital Frequency Up-converter 60

RF TRANSMISSION CIRCUIT, COMPLEX DIGITAL SYNTHESIZER, AND MRI APPARATUS

CROSS REFERENCE TO RELATED APPLICATIONS

This application claims the benefit of Japanese Application No.2001-203566 filed Jul. 4, 2001.

BACKGROUND OF THE INVENTION

The present invention relates to an RF (Radio Frequency) transmission circuit, a complex digital synthesizer, and an MRI (Magnetic Resonance Imaging) apparatus, and particularly to an RF transmission circuit, a complex digital synthesizer, and an MRI apparatus which are based on the circuit digitization so that the stability of signal quantity can be enhanced and the cost can be reduced.

Figure 15:
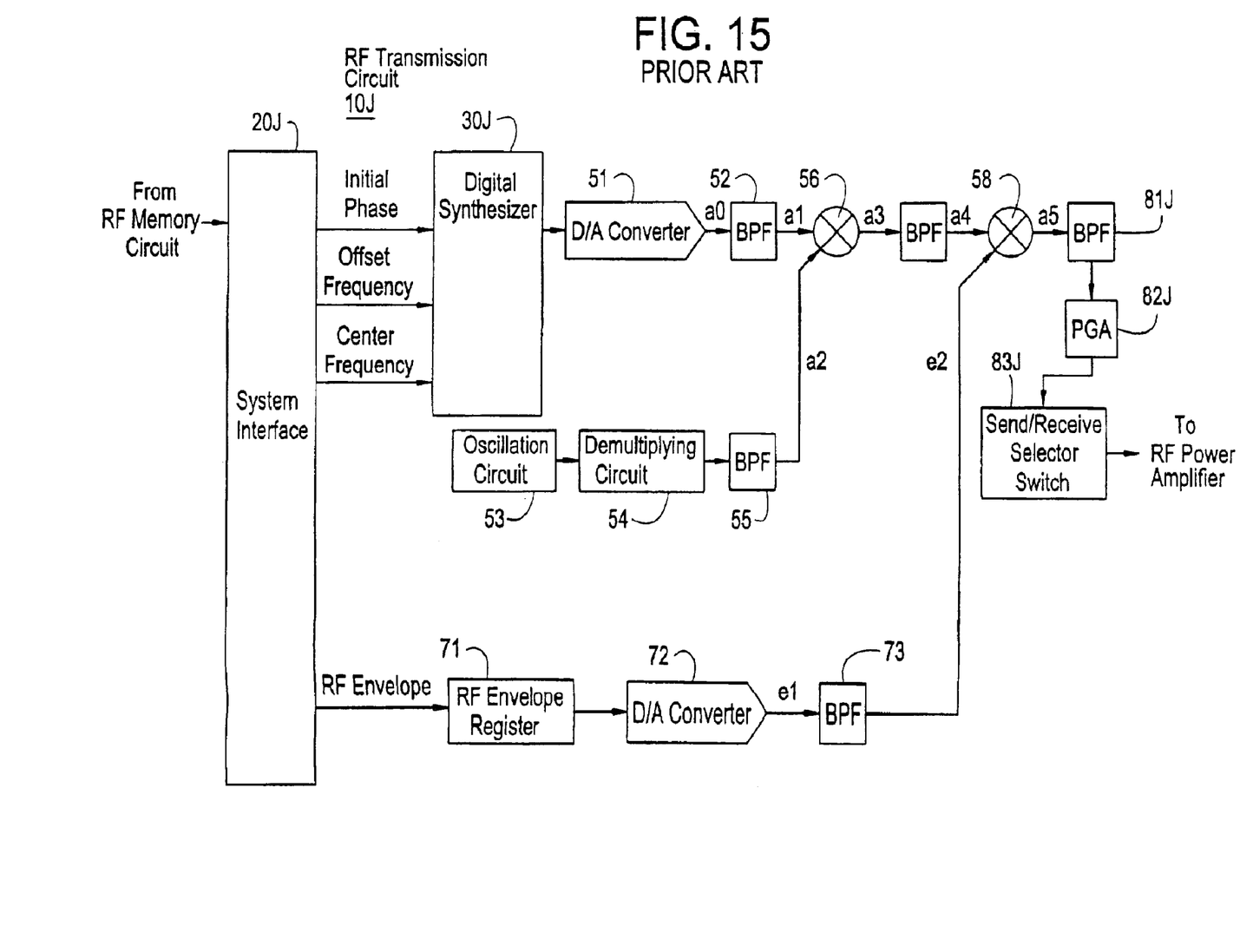
FIG. 15 is a block diagram showing a prior art RF transmission circuit.

FIG. 15 is a block diagram showing a prior art RF transmission circuit which can be used with a MRI apparatus.

This RF transmission circuit 10J includes a digital circuit section and an analog circuit section.

The digital circuit section includes a system interface 20J which receives control data from a high-ranking circuit which controls the scanning, a digital synthesizer 30J which generates a reference carrier frequency signal data under control of the system interface 20J, and an RF envelope register 71 which holds RF envelope data released by the system interface 20J.

The analog circuit section includes a D/A converter 51 which converts the reference carrier frequency signal data into an analog reference carrier frequency signal a0, a band-pass filter 52 which eliminates the alias harmonics emerging in the analog reference carrier frequency signal a0 and releases a resulting reference carrier frequency signal a1, an oscillation circuit 53 and frequency demultiplying circuit 54 which produce a mixing signal for up-converting the carrier frequency to a resonant frequency necessary at an intended static magnetic field strength, a band-pass filter 55 which eliminates spurious frequency components from the mixing signal to produce a mixing signal a2, a carrier mixer 56 which combines the reference carrier frequency signal a1 and the mixing signal a2 and releases a resulting carrier frequency signal a3, a band-pass filter 57 which eliminates spurious frequency components from the carrier frequency signal a3 to produce a carrier frequency signal a4, a D/A converter 72 which converts the RF envelope data into an analog RF envelope signal e1, a band-pass filter 73 which eliminates the alias harmonics emerging in the analog RF envelope signal e1 and releases a resulting RF envelope signal e2, an RF envelope mixer 58 which combines the carrier frequency signal a4 and the RF envelope signal e2 and releases a resulting analog RF pulse signal a5, a band-pass filter 81J which eliminates spurious frequency components from the analog RF pulse signal a5 and releases a resulting RF pulse signal, a programmable-gain amplifier 82J, and a send/receive selector switch 83J.

The above-mentioned conventional RF transmission circuit 10J has much of its process, particularly the mixing process and associated band-pass filtering process, done by the analog circuit section.

However, analog component parts inevitably have the disparity of characteristics, which results problematically in the instability of signal quantity. The need of choosing analog component parts having less disparity of characteristics results problematically in an increased cost.

SUMMARY OF THE INVENTION

Accordingly, it is an object of the present invention to provide an RF transmission circuit, a complex digital synthesizer, and an MRI apparatus which are based on the circuit digitization so that the stability of signal quantity can be enhanced and the cost can be reduced.

At a first viewpoint, the present invention resides in an RF transmission circuit, which is characterized by comprising a system interface which receives control data from outside, a complex digital synthesizer which releases a reference carrier frequency signal in accordance with the command from the system interface, an RF envelope mixer which combines the reference carrier frequency signal and an RF envelope waveform signal and releases a resulting reference RF pulse signal in the complex form, a digital frequency up-converter which up-converts the carrier frequency of the reference RF pulse signal to a resonant frequency necessary at an intended static magnetic field strength and converts the resulting signal into an analog RF pulse signal, and an analog rousing circuit which filters out the alias harmonics emerging in the analog RF pulse signal and adjusts the amplitude of the resulting signal.

The RF transmission circuit of the first viewpoint, in which the reference carrier frequency signal and the RF envelope waveform signal are combined in the digital domain, does not need an analog mixer circuit, and accordingly the stability of signal quantity can be enhanced and the cost can be reduced. Moreover, the reference carrier frequency signal is generated directly and up-converted in the digital domain, eliminating the need of analog frequency converter circuit and analog band-pass filter circuit, and accordingly the stability of signal quantity can be enhanced and the cost can be reduced.

At a second viewpoint, the present invention resides in an RF transmission circuit of the above-mentioned arrangement, which is characterized by including a digital attenuator which adjusts the amplitude of the RF envelope waveform signal in accordance with the command of the system interface.

The RF transmission circuit of the second viewpoint can implement the fine adjustment of the RF pulse amplitude accurately in the digital domain.

At a third viewpoint, the present invention resides in an RF transmission circuit of the above-mentioned arrangement, which is characterized by including a resonant frequency adjusting controller which alters in accordance with the command of the system interface the resonant frequency to be up-converted by the digital frequency up-converter.

The RF transmission circuit of the third viewpoint is capable of dealing with different static magnetic field strengths on a software basis by altering the resonant frequency, while using the same hardware arrangement, and it reduces the cost.

At a fourth viewpoint, the present invention resides in an RF transmission circuit of the above-mentioned arrangement, which is characterized by having a system clock frequency of 40 MHz or higher.

The RF transmission circuit of the fourth viewpoint is capable of processing properly signals of up to 15 MHz that is 80% of the Nyquist frequency.

At a fifth viewpoint, the present invention resides in an RF transmission circuit of the above-mentioned arrangement, which is characterized in that the complex digital synthesizer has an operational clock frequency of 40 MHz or higher.

The RF transmission circuit of the fifth viewpoint is capable of dealing with reference carrier frequencies up to 15 MHz that is 80% of the Nyquist frequency.

At a sixth viewpoint, the present invention resides in an RF transmission circuit of the above-mentioned arrangement, which is characterized in that the digital frequency up-converter has an operational clock frequency of 40 MHz or higher.

The RF transmission circuit of the sixth viewpoint is capable of dealing with resonant frequencies up to 15 MHz that is 80% of the Nyquist frequency (up to a static magnetic field strength of 0.35T).

At a seventh viewpoint, the present invention resides in an RF transmission circuit of the above-mentioned arrangement, which is characterized in that the digital frequency up-converter has an operational clock frequency of 160 MHz or higher.

The RF transmission circuit of the seventh viewpoint is capable of dealing with resonant frequencies up to 64 MHz that is 80% of the Nyquist frequency (up to a static magnetic field strength of 1.5T).

At an eighth viewpoint, the present invention resides in an RF transmission circuit of the above-mentioned arrangement, which is characterized in that the, system interface provides the complex digital synthesizer with data which determines the center frequency of the reference carrier frequency signal, data which offsets the center frequency of the actual reference carrier frequency signal from the center frequency, and data which determines the initial phase of the reference carrier frequency with respect to the RF envelope waveform.

The RF transmission circuit of the eighth viewpoint is capable of specifying the center frequency of reference carrier frequency, the offset frequency, and the initial phase.

At a ninth viewpoint, the present invention resides in an RF transmission circuit of the above-mentioned arrangement, which is characterized in that the complex digital synthesizer comprises a center frequency accumulator for calculating by summing cumulatively data which determines the center frequency of the reference carrier frequency signal, an offset frequency accumulator for calculating by summing cumulatively data which offsets the center frequency of the actual reference carrier frequency signal from the center frequency, an initial phase register for holding data which determines the initial phase of the reference carrier frequency with respect to the RF envelope waveform, an adder which adds the above-mentioned data, a cosine lookup table which has a record of cosine waveform data, and reads out cosine waveform data by being addressed by data resulting from the summation by the adder and releases as inphase component data, and a sine lookup table which has a record of sine waveform data, and reads out sine waveform data by being addressed by data resulting from the summation by the adder and releases as quadrature component data.

The RF transmission circuit of the ninth viewpoint is capable of generating a reference carrier frequency signal, with its center frequency, offset frequency and initial phase being specified, directly in the complex form.

At a tenth viewpoint, the present invention resides in an RF transmission circuit of the above-mentioned arrangement, which is characterized in that the digital frequency up-converter comprises a complex interpolation filter which implements an interpolation process and filtering process for inphase component data and quadrature component data and releases resulting inphase component data and quadrature component data having a raised data sampling rate, a complex digital synthesizer which generates inphase component data and quadrature component data of a mixing signal, an up-convert mixer which combines the inphase component data and quadrature component data having the raised data sampling rate and the mixing signal thereby to produce and release inphase component data and quadrature component data having a raised carrier frequency, an adder which combines the inphase component data and quadrature component data having the raised carrier frequency and releases a resulting digital RF pulse signal, and a D/A converter which converts the digital RF pulse signal into an analog RF pulse signal.

The RF transmission circuit of the tenth viewpoint is capable of up-converting the carrier frequency digitally and directly to an intended resonant frequency and releasing an analog RF pulse signal.

At an eleventh viewpoint, the present invention resides in an RF transmission circuit of the above-mentioned arrangement, which is characterized in that the digital frequency up-converter includes a PLL synthesizer which produces for the digital frequency up-converter an operational clock signal, which is higher in frequency than the system clock signal, from the system clock signal.

The RF transmission circuit of the eleventh viewpoint, in which the operational clock frequency of the digital frequency up-converter can be altered by the PLL synthesizer, is capable of readily dealing with different resonant frequencies (different static magnetic field strengths).

At a twelfth viewpoint, the present invention resides in an RF transmission circuit of the above-mentioned arrangement, which is characterized in that the analog rousing circuit comprises a low-pass filter which eliminates the alias harmonics from the analog RF pulse signal, a programmable-gain amplifier which adjusts the amplitude of the analog RF pulse signal, and a send/receive selector switch.

The RF transmission circuit of the twelfth viewpoint is capable of producing properly an analog RF pulse signal having a carrier frequency which is equal to the resonant frequency necessary at an intended static magnetic field strength.

At an thirteenth viewpoint, the present invention resides in an MRI apparatus, which is characterized by including an RF transmission circuit of the above-mentioned arrangement.

The MRI apparatus of the thirteenth viewpoint fosters the circuit digitization, and the stability of signal quantity can be enhanced and the cost can be reduced.

At a fourteenth viewpoint, the present invention resides in a complex digital synthesizer, which is characterized by comprising a center frequency accumulator for calculating by summing cumulatively data which determines the center frequency of a reference carrier frequency signal, an offset frequency accumulator for calculating by summing cumulatively data which offsets the center frequency of the actual reference carrier frequency signal from the center frequency, an initial phase register for holding data which determines the initial phase of the reference carrier frequency with respect to an RF envelope waveform, an adder which adds the above-mentioned data, a cosine lookup table which has a record of cosine waveform data, and reads out cosine waveform data by being addressed by data resulting from the summation by the adder and releases as inphase component data, and a sine lookup table which has a record of sine waveform data, and reads out sine waveform data by being addressed by data resulting from the summation by the adder and releases as quadrature component data.

The complex digital synthesizer of the fourteenth viewpoint is capable of generating a reference carrier frequency signal, with its center frequency, offset frequency and initial phase being specified, directly in the complex form.

At a fifteenth viewpoint, the present invention resides in a complex digital synthesizer of the above-mentioned arrangement, which is characterized by having an operational clock frequency of 40 MHz or higher.

The complex digital synthesizer of the fifteenth viewpoint is capable of generating a reference carrier frequency up to 15 MHz that is 80% of the Nyquist frequency.

At an sixteenth viewpoint, the present invention resides in an MRI apparatus, which is characterized by including a complex digital synthesizer of the above-mentioned arrangement.

The MRI apparatus of the sixteenth viewpoint fosters the circuit digitization, and the stability of signal quantity can be enhanced and the cost can be reduced.

According to the inventive RF transmission circuit, complex digital synthesizer and MRI apparatus, the carrier and RF envelope are combined in the digital domain, and the need of analog mixer circuit is eliminated, whereby the stability of signal quantity can be enhanced and the cost can be reduced. The carrier is generated and up-converted in the digital domain, and the need of analog frequency up-converter circuit and analog band-pass filter circuit is eliminated, whereby the stability of signal quantity can be enhanced and the cost can be reduced.

Further objects and advantages of the present invention will be apparent from the following description of the preferred embodiments of the invention as illustrated in the accompanying drawings.

DETAILED DESCRIPTION OF THE INVENTION

The following explains the illustrated embodiments of the present invention.

Figure 1:
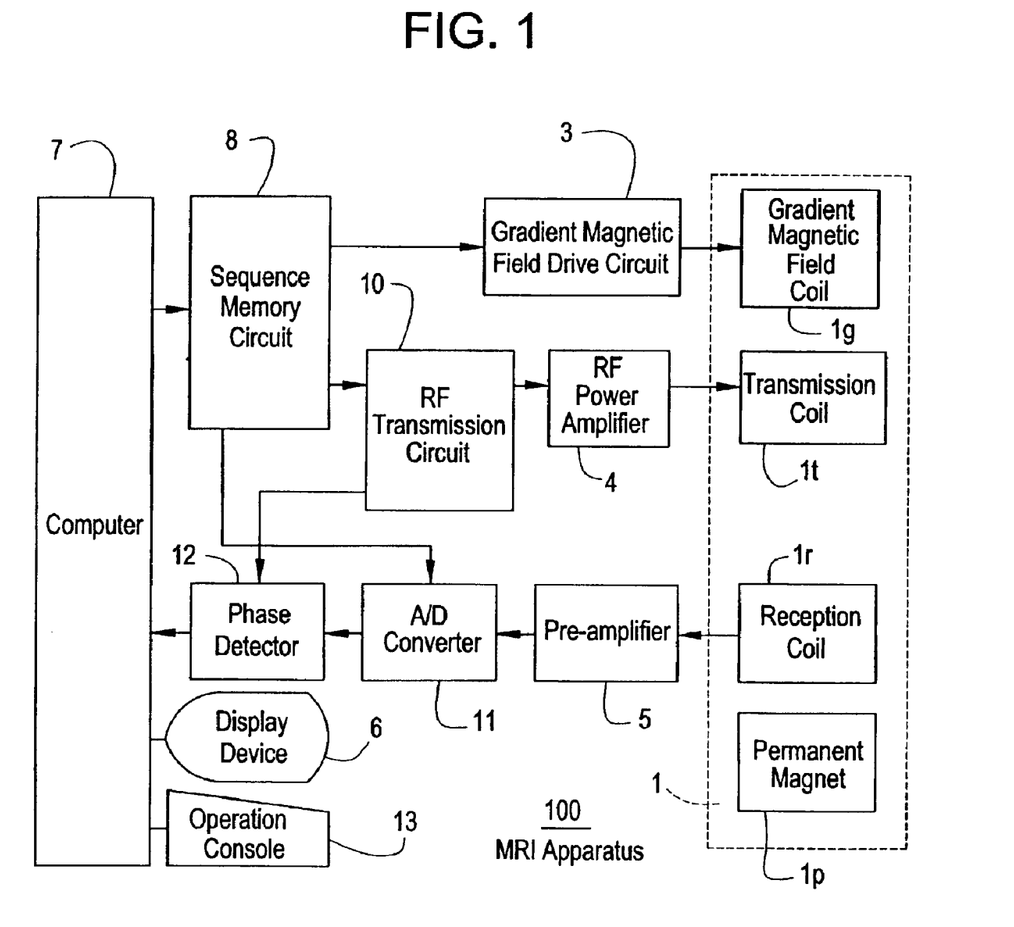
FIG. 1 is a block diagram showing the MRI apparatus based on an embodiment of this invention.

FIG. 1 is a block diagram showing an MRI apparatus 100 based on an embodiment of this invention.

In this MRI apparatus 100, a magnet assembly 1 has a room section (bore) in which a subject of inspection is placed. Disposed around the room section are a permanent magnet 1p which applies a constant static magnetic field to the subject, a gradient magnetic field coil 1g for generating a gradient magnetic field of the x axis, y axis and z axis (a slice gradient axis, read gradient axis, phase encode gradient axis are formed by the combination of the x axis, y axis and z axis), a transmission coil 1t which produces an RF pulse for inducing the spin of atomic nucleus in the subject, and a reception coil 1r which detects the NMR signal from the subject. The gradient magnetic field coil 1g, transmission coil 1t and reception coil 1r are connected to a gradient magnetic field drive circuit 3, RF power amplifier 4 and pre-amplifier 5, respectively.

In place of the permanent magnet 1p, a static magnetic field power supply and a static magnetic field coil may be used.

A sequence memory circuit 8, which operates in accordance with the commands from a computer 7 and based on the stored pulse sequence, operates on the gradient magnetic field drive circuit 3 so that the gradient magnetic field coil 1g of the magnet assembly 1 generates a gradient magnetic field, operates on an RF transmission circuit 10 to generate an RF pulse signal, puts the signal into the RF power amplifier 4, and applies the amplified RF pulse signal to the transmission coil 1t of the magnet assembly 1 so that an intended image plane is roused.

The RF transmission circuit 10 will be explained in detail later.

The pre-amplifier 5 amplifies the NMR signal from the subject received by the reception coil 1r of the magnet assembly 1 and puts the amplified signal into an A/D converter 11. The A/D converter 11 converts the NMR signal into digital data and puts into a phase detector 12. The phase detector 12 implements the phase detection for the NMR signal by digital signal processing, and puts the result into a computer 7.

The computer 7 which receives information entered from an operation console 13. The computer 7 also reads the digital data from the phase detector 12 and implements the calculation of image reconstruction to produce an MR image. The computer 7 further implements general control.

A display device 13 displays the MR image.

Figure 2:
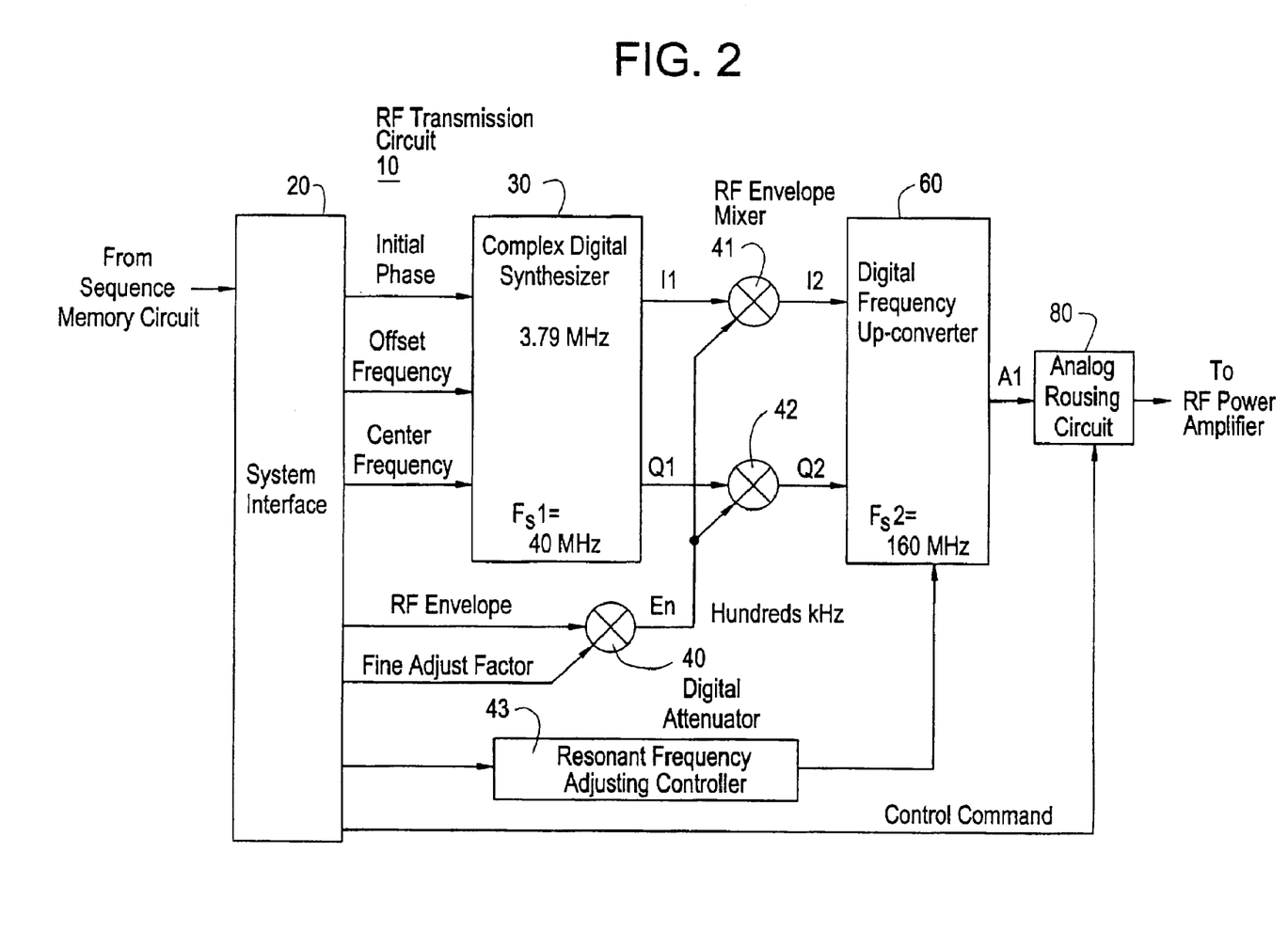
FIG. 2 is a block diagram showing the RF transmission circuit based on an embodiment of this invention.

FIG. 2 is a block diagram showing the arrangement of the RF transmission circuit 10.

This RF transmission circuit 10 includes a system interface 20, a complex digital synthesizer 30, a digital attenuator

40, RF envelope mixers 41 and 42, a resonant frequency adjusting controller 43, a digital frequency up-converter 60, and an analog rousing circuit 80.

The RF transmission circuit 10 is supplied with a system clock signal of 40 MHz for example.

The system interface 20 includes a data decoder/data router logic circuit, and it receives data from the sequence memory circuit 8 and controls the complex digital synthesizer 30, etc. in accordance with the data.

The data provided by the sequence memory circuit 8 includes carrier frequency component data, offset frequency component data, initial phase information, RF envelope waveform information to be sent, fine adjustment factor information used for the calculation of fine adjustment of the RF envelope waveform, and control command information used to control the analog rousing circuit 80. These data are updated at certain time intervals which are specified individually.

The complex digital synthesizer 30 operates based on the center frequency, offset frequency and initial phase input by the system interface 20 to release an inphase component data I1 and quadrature component data Q1 of the reference carrier frequency signal. The inphase component data I1 and quadrature component data Q1 are equivalent to the cosine signal component and sine signal component, respectively, of the complex form.

The reference carrier frequency to be generated is 6.04 MHz, 7.35 MHz, 3.79 MHz, or 6.36 MHz for a static magnetic field strength of 0.2T, 0.35T, 0.5T, or 1.5T, respectively, for example.

For minimizing the fall of SFDR (Spurious Free Dynamic Range) caused by the aliasing effect of the digital synthesizer, the reference carrier frequency to be generated is set to be about 80% of the Nyquist frequency.

For example, when the 40-MHz system clock frequency is used intact for the operation clock frequency, in which case the Nyquist frequency is 20 MHz for the operational clock frequency Fs1 of 40 MHz, the reference carrier frequency to be generated is set to be 15 MHz or lower.

On the other hand, when the reference carrier frequency to be generated is 6.04 MHz, 7.35 MHz, 3.79 MHz, or 6.36 MHz for a static magnetic field strength of 0.2T, 0.35T, 0.5T, or 1.5T, respectively, for example, the operational clock frequency is set to be 15.1 MHz, 18.375 MHz, 9.745 MHz, or 15.9 MHz for a static magnetic field strength of 0.2T, 0.35T, 0.5T, or 1.5T, respectively, for example.

The digital attenuator 40 is a digital multiplier which multiplies the RF envelope waveform data and the fine adjustment factor data entered through the system interface 20, and releases an amplitude-adjusted RF envelope signal data En. It is adjusted such that the amplitude-adjusted RF envelope signal data En is equal to the entered RF envelope waveform data (i.e., 0 dB gain) when the fine adjustment factor is the largest-possible value.

The RF envelope mixer 41 is a digital multiplier which combines the inphase component data I1 of the reference carrier frequency signal and the amplitude-adjusted RF envelope signal data En, and releases inphase component data I2 of the reference RF pulse signal.

The RF envelope mixer 42 is a digital multiplier which combines the quadrature component data Q1 of the reference carrier frequency signal and the amplitude-adjusted RF envelope signal data En, and releases quadrature component data Q2 of the reference RF pulse signal.

The digital frequency up-converter 60 implements the up-sampling of reference RF pulse signals I2 and Q2 and the up-conversion of the reference carrier frequency to the resonant frequency necessary at the intended static magnetic field strength based on the interpolation process and filtering, and converts the resulting signal into an analog RF pulse signal A1.

The reference frequency is 8.54 MHz, 14.85 MHz, 21.29 MHz, or 63.86 MHz for a static magnetic field strength of 0.2T, 0.35T, 0.5T, or 1.5T, respectively, for example.

The subject of up-conversion is the carrier frequency of the RF pulse signal, and it is not the RF envelope waveform. The RF envelope waveform has a much lower frequency as compared with the carrier frequency, and it is preserved for the amplitude information of the carrier frequency signal.

For the satisfactory SFDR of the digital frequency up-converter 60 also, the resonant frequency is set to be about 80% or lower of the Nyquist frequency of the sampling frequency of D/A conversion.

For example, when the 40-MHz system clock frequency multiplied by 4 is used for the operational clock frequency, in which case the Nyquist frequency is 80 MHz for the operational clock frequency Fs2 of 160 MHz, the resonant frequency is set to be 64 MHz or lower.

On the other hand, when the resonant frequency is 8.54 MHz, 14.85 MHz, 21.29 MHz, or 63.86 MHz for a static magnetic field strength of 0.2T, 0.35T, 0.5T, or 1.5T, respectively, the operational clock frequency is set to be 21.35 MHz, 37.125 MHz, 53.225 MHz, or 159.7 MHz for a static magnetic field strength of 0.2T, 0.35T, 0.5T, or 1.5T, respectively, for example.

The resonant frequency adjusting controller 43 is a microprocessor which initializes the digital frequency up-converter 60 and alters the resonant frequency to be up-converted.

The analog rousing circuit 80 filters out the alias harmonics emerging in the analog RF pulse signal A1 and adjusts the amplitude of the resulting signal.

Figure 3:
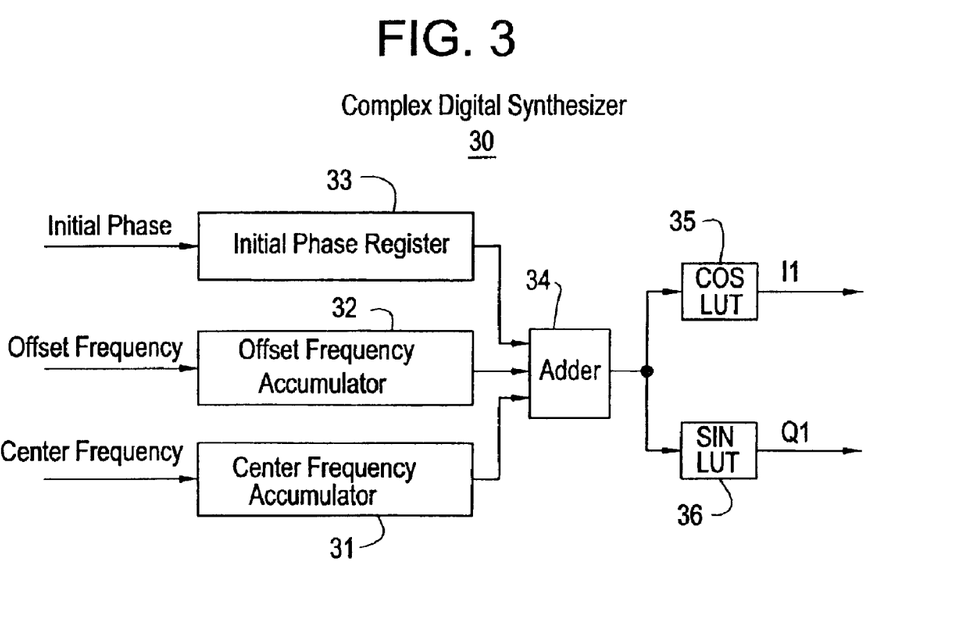
FIG. 3 is a block diagram showing an example of the arrangement of the complex digital synthesizer based on an embodiment of this invention.

FIG. 3 is a block diagram showing an example of arrangement of the complex digital synthesizer 30.

The complex digital synthesizer 30 is made up of a center frequency accumulator 31 for calculating by summing cumulatively data which determines the center frequency of the reference carrier frequency signal, an offset frequency accumulator 32 for calculating by summing cumulatively data which offsets the center frequency of the actual reference carrier frequency signal from the center frequency, an initial phase register 33 for holding data which determines the initial phase of the reference carrier frequency with respect to the RF envelope waveform, an adder 34 which adds the above-mentioned data, a cosine lookup table 35 which has a record of cosine waveform data, and reads out cosine waveform data by being addressed by data resulting from the summation by the adder 34 and releases as inphase component data, and a sine lookup table 36 which has a record of sine waveform data, and reads out sine waveform data by being addressed by data resulting from the summation by the adder 34 and releases as quadrature component data.

Figure 4:
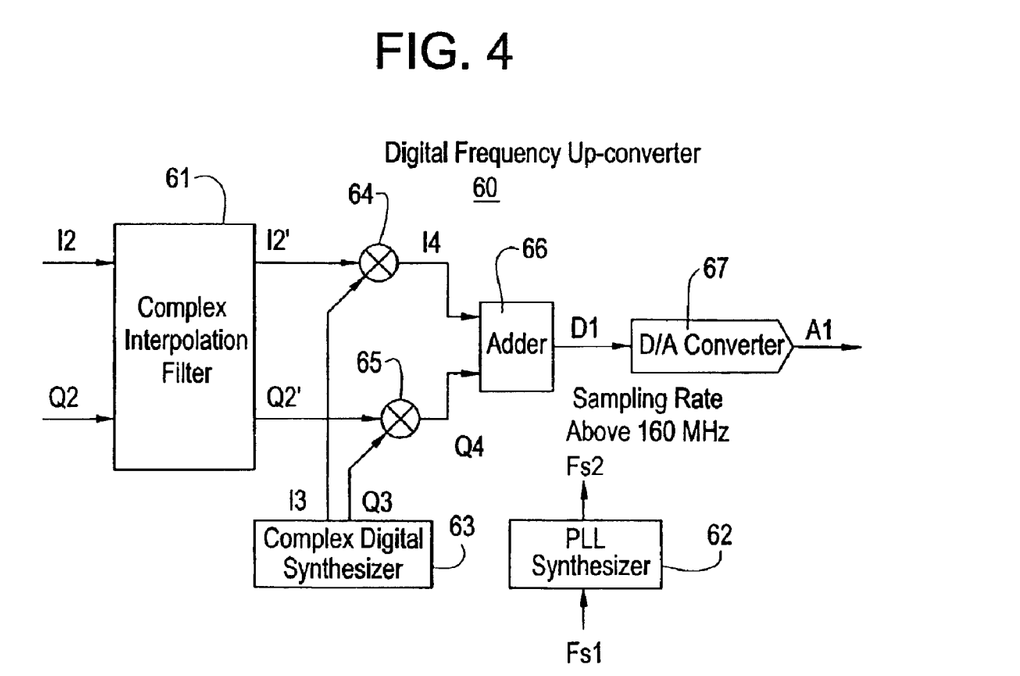
FIG. 4 is a block diagram showing an example of the arrangement of the digital frequency up-converter.

FIG. 4 is a block diagram showing an example of arrangement of the digital frequency up-converter 60.

The digital frequency up-converter 60 is made up of a complex interpolation filter 61 which implements an interpolation process and filtering process for the inphase component data I2 and quadrature component data Q2 and releases resulting inphase component data I2' and quadrature component data Q2', with their data sampling rate being raised to 160 MHz, for example, a PLL (Phase Locked Loop) 62 which generates and operational clock signal Fs2 of 160 MHz from the 40-MHz system clock signal, a complex digital synthesizer 63 which generates inphase component data I3 and quadrature component data Q3 of a mixing signal, up-convert mixers 64 and 65 which combine the inphase component data I2' and quadrature component data Q2' and the mixing signal components I3 and Q3 thereby to produce and release inphase component data I4 and quadrature component data Q4 having a raised carrier frequency, an adder which combines the inphase component data I4 and quadrature component data Q4 and releases a resulting digital RF pulse signal D1,and a D/A converter 67 which converts the digital RE pulse signal D1 into an analog RF pulsed signal A1.

The mixing signal frequency is 2.50 MHz, 7.5 MHz, 17.5 MHz, or 57.5 MHz for a static magnetic field strength of 0.2T, 0.35T, 0.5T, or 1.5T, respectively, for example. Consequently, the up-converted carrier frequency becomes 8.54 MHz, 14.85 MHz, 21.29 MHz, or 63.86 MHz for a static magnetic field strength of 0.2T, 0.35T, 0.5T, or 1.5T, respectively, for example, and which is equal to the resonant frequency.

The digital frequency up-converter 60 may alternatively be arranged by use of an LSI (Large Scale Integration) module such as AD9856 for example.

Figure 5:
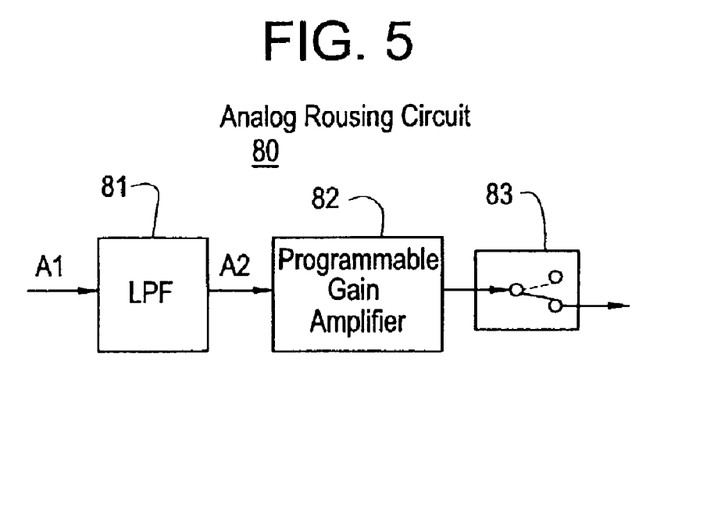
FIG. 5 is a block diagram showing an example of the arrangement of the analog rousing circuit.

FIG. 5 is a block diagram showing an example of arrangement of the analog rousing circuit 80.

The analog rousing circuit 80 is made up of a low-pass filter 81 which eliminates the alias harmonics from the analog RF pulse signal A1 and releases a resulting analog RF pulse signal A2, and a programmable-gain amplifier 82 which adjusts the amplitude of the analog RF pulse signal A2, and a send/receive selector switch 83.

Figure 6:
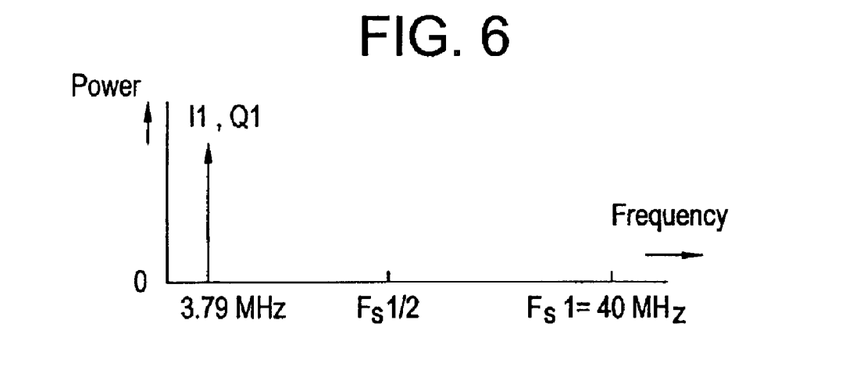
FIG. 6 is a diagram showing as an example the power spectrum of the reference carrier frequency signal.

FIG. 6 is a conceptual diagram showing the power spectrum of the inphase component data I1 and quadrature component data Q1 released by the complex digital synthesizer 30.

Shown in FIG. 6 is of the case where the reference carrier frequency is 3.79 MHz and operational clock (Fsl) frequency is 40 MHz.

Figure 7:
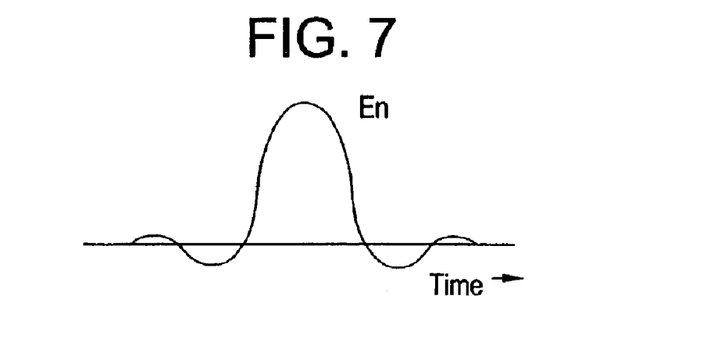
FIG. 7 is a diagram showing as an example the waveform of the RF envelope signal data.

FIG. 7 is a conceptual diagram showing an example of the waveform of the RF envelope signal En released by the digital attenuator 40.

Shown in FIG. 7 is of the case of the sinc waveform.

Figure 8:
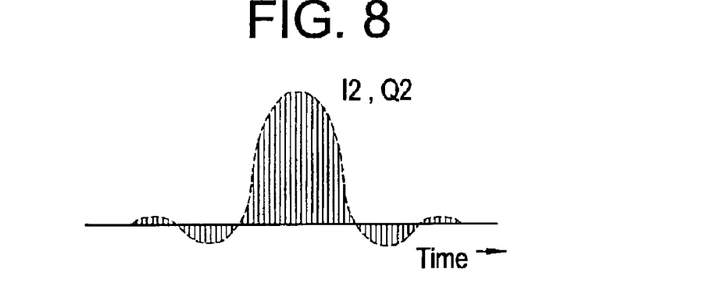
FIG. 8 is a diagram showing as an example the waveform of the reference RF pulse signal data.

FIG. 8 is a conceptual diagram showing the waveform of the inphase component data I2 and quadrature component data Q2 released by the RF envelope mixers 41 and 42.

Figure 9:
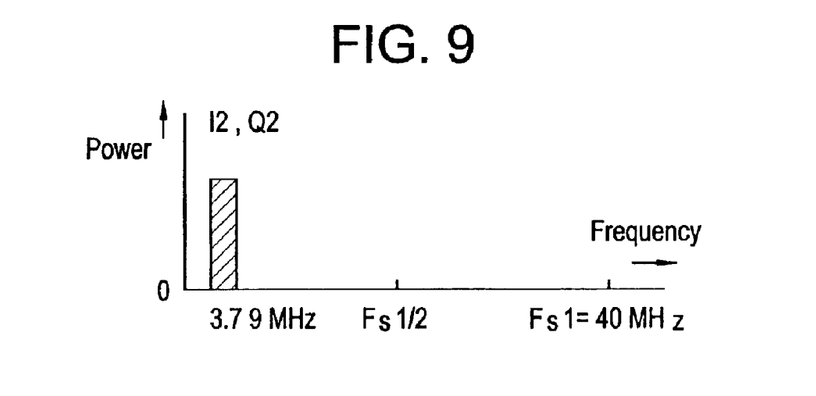
FIG. 9 is a diagram showing as an example the power spectrum of the reference RF pulse signal data.

FIG. 9 is a conceptual diagram showing the power spectrum of the inphase component data I2 and quadrature component data Q2 of the reference RF pulse signal.

The spectrum having its center at the reference carrier frequency is expanded by the width of frequency of the RF envelope signal En.

Figure 10:
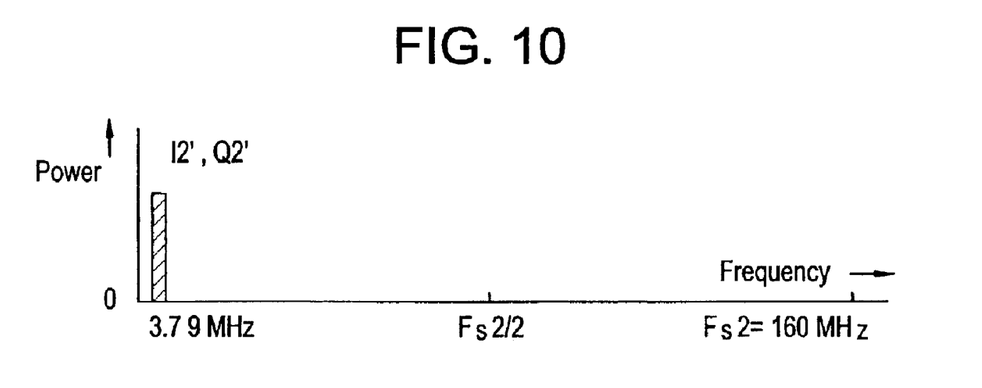
FIG. 10 is a diagram showing as an example the power spectrum of the reference RF pulse signal data having a raised sampling rate.

FIG. 10 is a conceptual diagram showing the power spectrum of the inphase component data I2' and quadrature component data Q2', with the sampling rate being raised to 160 MHz, for example, by the complex interpolation filter 61.

Figure 11:
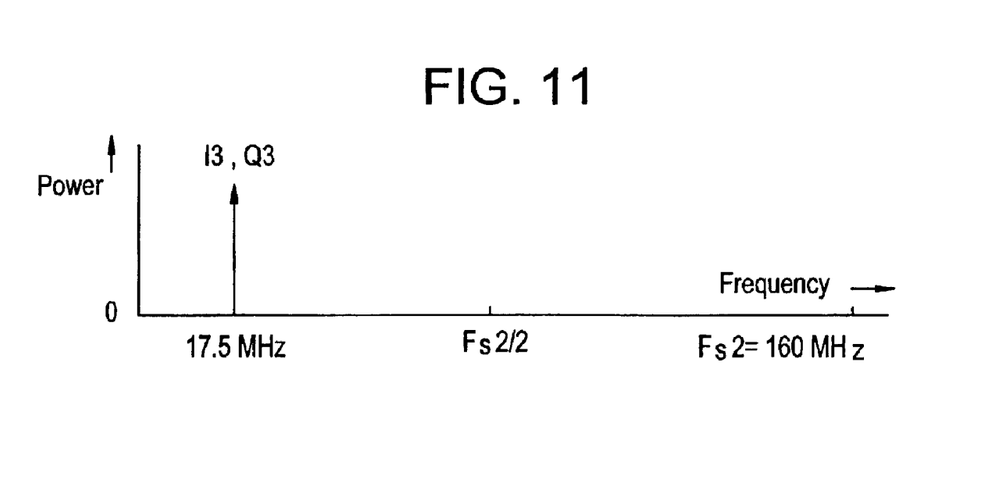
FIG. 11 is a diagram showing as an example the power spectrum of the mixing signal.

FIG. 11 is a conceptual diagram showing the power spectrum of the inphase component data I3 and quadrature component data Q3 of the mixing signal generated by the complex digital synthesizer 63.

Shown in FIG. 11 is of the case where the mixing signal frequency is 17.5 MHz.

Figure 12:
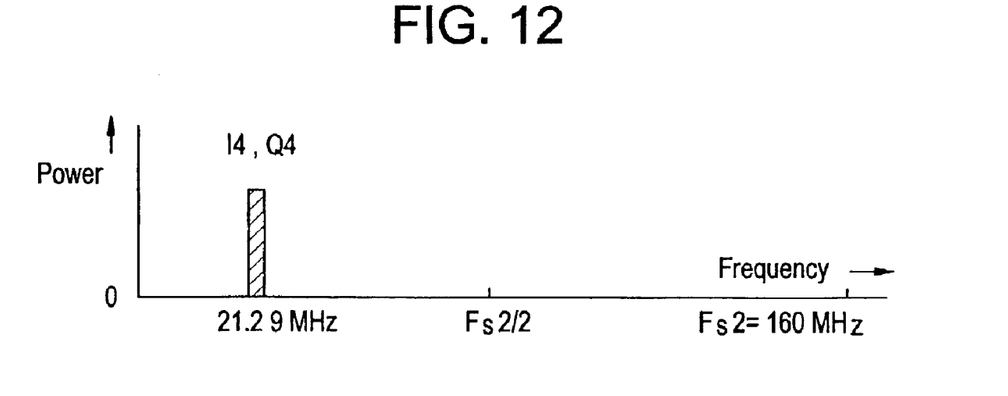
FIG. 12 is a diagram showing as an example the power spectrum of the signal data resulting from the combining of the reference RF pulse signal data having a raised sampling rate and the mixing signal.

FIG. 12 is a conceptual diagram showing the power spectrum of the inphase component data I4 and quadrature component data Q4 released by the up-convert mixers 64 and 65.

The reference carrier frequency (3.79 MHz in this example) is up-converted by the amount of mixing signal frequency (17.5 MHz in this example) (to become 21.29 MHz in this example).

Figure 13:
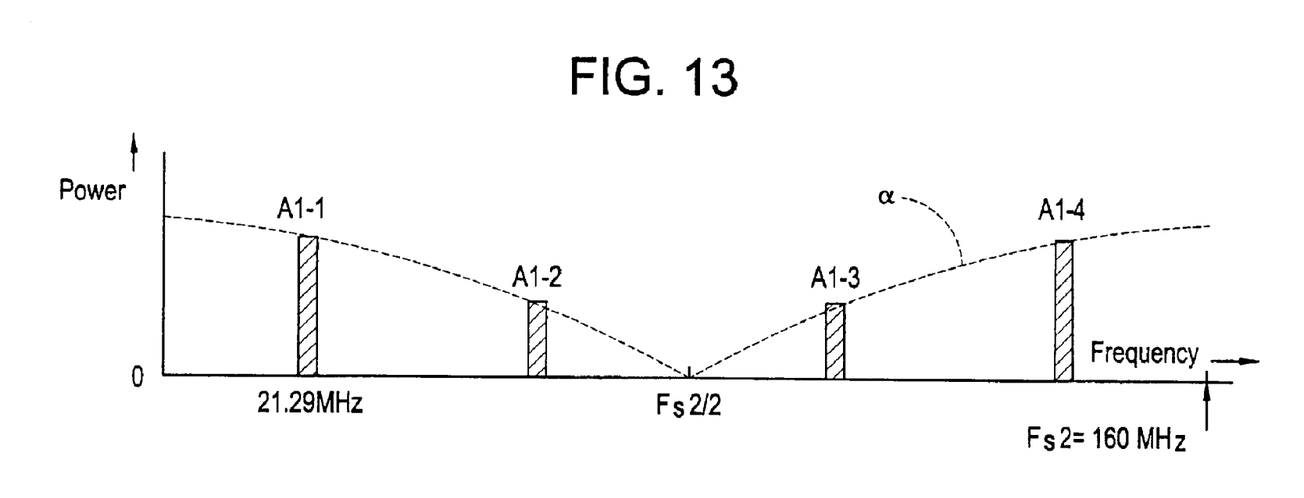
FIG. 13 is a diagram showing as an example the power spectrum of the analog RF pulse signal.

FIG. 13 is a conceptual diagram showing the power spectrum of the analog RF pulse signal A1 released by the D/A converter 67.

Spectrum A1-1 is of the baseband and other spectrums A1-2 through A1-4 are of the alias harmonics.

Indicated by α is the SINC characteristics of the D/A converter 67.

Figure 14:
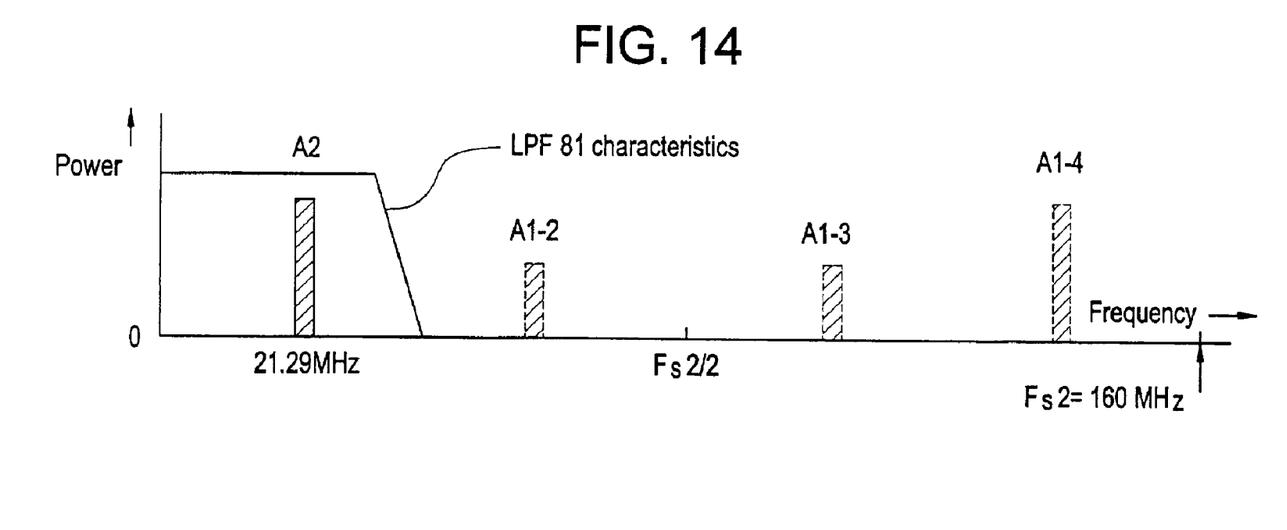
FIG. 14 is a diagram showing as an example the power spectrum of the analog RF pulse signal, with spurious harmonics being removed.

FIG. 14 is a conceptual diagram showing the power spectrum of the analog RF pulse signal A2, with the alias harmonics A1-2 through A1-4 being eliminated by the low-pass filter 81.

In consequence, the analog RF pulse signal A2 having the carrier frequency derived from the resonant frequency (21.29 MHz in this example) necessary at an intended static magnetic field strength (0.5T in this example) is obtained.

The foregoing RF transmission circuit 10 achieves the following effectiveness.

(1) The RF envelope mixers 41 and 42 implement the combining of the reference carrier frequency signal data I1 and Q1 and the RF envelope signal data En in the digital domain, eliminating the need of analog mixer circuit, whereby the stability of signal quantity can be enhanced and the cost can be reduced.

The complex digital synthesizer 30 generates the reference carrier frequency signal data I1 and Q1 directly in digital manner. The digital frequency up-converter 60 up-converts their frequency in the digital domain. Consequently, the need of analog frequency up-converter circuit and analog band-pass filter circuit is eliminated, whereby the stability of signal quantity can be enhanced and the cost can be reduced.

(2) The digital attenuator 40 implements the fine adjustment of the RF pulse amplitude accurately in the digital domain.

(3) The resonant frequency adjusting controller 43 is operative to alter the resonant frequency, enabling the RF transmission circuit 10 to deal with different static magnetic field strengths on a software basis, while using the same hardware arrangement, whereby the cost can be reduced.

(4) The complex digital synthesizer 30 has its operational clock frequency set to 40 MHz, enabling the RF transmission circuit 10 to deal with the generation of reference carrier frequencies up to 15 MHz.

(5) The digital frequency up-converter 60 operates at a 160-MHz clock frequency, enabling the RF transmission circuit 10 to deal with resonant frequencies up to 64 MHz that is 80% of half the operational clock frequency. It signifies that the MRI apparatus of the same hardware arrangement can deal with static magnetic field strengths up to 1.5T, whereby the cost can be reduced.

(6) The RF transmission circuit 10 can readily be designed on an LSI basis. It also allows the use of LSI parts available on the market, whereby the cost can be reduced.

If the digital frequency up-converter 60 is operated at a clock frequency of 325 MHz or higher, the RF transmission circuit 10 is applicable to MRI apparatus having static magnetic field strengths up to 3T. If the digital frequency up-converter 60 is operated at a clock frequency of 450 MHz or higher, the RF transmission circuit 10 is applicable to MRI apparatus having static magnetic field strengths up to 4T.

The foregoing RF transmission circuit 10 may be arranged partially or entirely by use of programmable devices such as CPLD (Complex Programmable Logic Device) or FPGA (Field-Programmable Logic Array).

Many widely different embodiments of the invention may be configured without departing from the spirit and the scope of the present invention. It should be understood that the present invention is not limited to the specific embodiments described in the specification, except as defined in the appended claims.

What is claimed is:

1. An RF transmission circuit comprising:
   a system interface which receives control data from outside;
   a complex digital synthesizer which releases a reference carrier frequency signal in accordance with the command from said system interface;
   an RF envelope mixer which combines the reference carrier frequency signal and an RF envelope waveform signal and releases a resulting reference RF pulse signal in the complex form;
   a digital frequency up-converter which up-converts the carrier frequency of the reference RF pulse signal to a resonant frequency necessary at an intended static magnetic field strength and converts the resulting signal into an analog RF pulse signal; and
   an analog rousing circuit which filters out alias harmonics emerging in the analog RF pulse signal and adjusts the amplitude of the resulting signal.

2. An RF transmission circuit set forth in claim 1, further including a digital attenuator which adjusts the amplitude of the RF envelope waveform signal in accordance with the command of said system interface.

3. An RF transmission circuit set forth in claim 1, further including a resonant frequency adjusting controller which alters in accordance with the command of said system interface the resonant frequency to be up-converted by said digital frequency up-converter.

4. An RF transmission circuit set forth in claim 1, having a system clock frequency of 40 MHz or higher.

5. An RF transmission circuit set forth in claim 1, wherein said complex digital synthesizer has an operational clock frequency of 40 MHz or higher.

6. An RF transmission circuit set forth in claim 1, wherein the operational clock frequency of said digital frequency up-converter is 40 MHz or higher.

7. An RF transmission circuit set forth in claim 6, wherein said digital frequency up-converter has an operational clock frequency of 160 MHz or higher.

8. An RF transmission circuit set forth in claim 1, wherein said system interface provides said complex digital synthesizer with data which determines the center frequency of the reference carrier frequency signal, data which offsets the center frequency of the actual reference carrier frequency signal from said center frequency, and data which determines the initial phase of the reference carrier frequency with respect to the RF envelope waveform.

9. An RF transmission circuit set forth in claim 8, wherein said complex digital synthesizer comprises:
   a center frequency accumulator for calculating by summing cumulatively data which determines the center frequency of the reference carrier frequency signal;
   an offset frequency accumulator for calculating by summing cumulatively data which offsets the center frequency of the actual reference carrier frequency signal from said center frequency;
   an initial phase register for holding data which determines the initial phase of the reference carrier frequency with respect to the RF envelope waveform;
   an adder which adds the outputs from said center frequency accumulator, said offset frequency accumulator, and said initial phase register;
   a cosine lookup table which has a record of cosine waveform data, and reads out cosine waveform data by being addressed by data resulting from the summation by said adder and releases as inphase component data; and
   a sine lookup table which has a record of sine waveform data, and reads out sine waveform data by being addressed by data resulting from the summation by said adder and releases as quadrature component data.

10. An RF transmission circuit set forth in any of claim 1, wherein said digital frequency up-converter comprises a complex interpolation filter which implements an interpolation process and filtering process for inphase component data and quadrature component data and releases resulting inphase component data and quadrature component data having a raised data sampling rate; a complex digital synthesizer which generates inphase component data and quadrature component data of a mixing signal; up-convert mixers which combine the inphase component data and quadrature component data having the raised data sampling rate and the mixing signal thereby to produce and release inphase component data and quadrature component data having a raised carrier frequency; an adder which combines the inphase component data and quadrature component data having the raised carrier frequency and releases a resulting digital RF pulse signal; and a D/A converter which converts the digital RF pulse signal into an analog RF pulse signal.

11. An RF transmission circuit set forth in claim 10, wherein said digital frequency up-converter includes a PLL synthesizer which produces for said digital frequency up-converter an operational clock signal, which is higher in frequency than the system clock signal, from the system clock signal.

12. An RF transmission circuit set forth in claim 1, wherein said analog rousing circuit comprises a low-pass filter which eliminates the alias harmonics from the analog RF pulse signal; a programmable-gain amplifier which adjusts the amplitude of the analog RF pulse signal; and a send/receive selector switch.

13. An MRI apparatus including an RF transmission circuit, said RF transmission circuit comprising:
   a system interface which receives control data from outside;
   a complex digital synthesizer which releases a reference carrier frequency signal in accordance with the command from said system interface;
   an RF envelope mixer which combines the reference carrier frequency signal and an RF envelope waveform signal and releases a resulting reference RF pulse signal in the complex from;
   a digital frequency up-converter which up-converts the carrier frequency of the reference RF pulse signal to a resonant frequency necessary at an intended static magnetic field strength and converts the resulting signal into an analog RF pulse signal; and
   an analog rousing circuit filters out alias harmonics emerging in the analog RF pulse signal and adjusts the amplitude of the resulting signal.

14. A complex digital synthesizer comprising:
   a center frequency accumulator for calculating by summing cumulatively data which determines the center frequency of a reference carrier frequency signal;

an offset frequency accumulator for calculating by summing cumulatively data which offsets the center frequency of the actual reference carrier frequency signal from said center frequency;

an initial phase register for holding data which determines the initial phase of the reference carrier frequency with respect to the RF envelope waveform;

an adder which adds a center frequency accumulator output, an offset frequency accumulator output, and an initial phase register output;

a cosine lookup table which has a record of cosine waveform data, and reads out cosine waveform data by being addressed by data resulting from the summation by said adder and releases as inphase component data; and a sine lookup table which has a record of sine waveform data, and reads out sine waveform data by being addressed by data resulting from the summation by said adder and releases as quadrature component data.

\* \* \* \* \*

UNITED STATES PATENT AND TRADEMARK OFFICE
CERTIFICATE OF CORRECTION

PATENT NO. : 6,862,435 B2
DATED : March 1, 2005
INVENTOR(S) : Miyano et al.

It is certified that error appears in the above-identified patent and that said Letters Patent is hereby corrected as shown below:

Column 12,
Line 61, between "circuit" and "filters" insert -- which --.

Signed and Sealed this

Sixteenth Day of August, 2005

JON W. DUDAS
*Director of the United States Patent and Trademark Office*